United States Patent [19]
Nishigohri et al.

[11] Patent Number: 5,886,387
[45] Date of Patent: Mar. 23, 1999

[54] BICMOS SEMICONDUCTOR INTEGRATED CIRCUIT DEVICE HAVING MOS TRANSISTOR AND BIPOLAR TRANSISTOR REGIONS OF DIFFERENT THICKNESS

[75] Inventors: Masahito Nishigohri, Kawasaki; Kazunari Ishimaru, Yokohama, both of Japan

[73] Assignee: Kabushiki Kaisha Toshiba, Tokyo, Japan

[21] Appl. No.: 716,729

[22] Filed: Sep. 23, 1996

[30] Foreign Application Priority Data

Sep. 27, 1995 [JP] Japan ................................... 7-249529

[51] Int. Cl.⁶ .......................... H01L 29/76; H01L 29/94; H01L 31/062; H01L 31/113
[52] U.S. Cl. .......................... 257/370; 257/205; 257/350; 257/361; 257/370; 257/273; 257/378
[58] Field of Search .................................. 257/205, 273, 257/350, 361, 370, 378

[56] References Cited

U.S. PATENT DOCUMENTS 5,331,193  7/1994  Mukogawa .............................. 257/350
5,543,653  8/1996  Grubisich .............................. 257/378

FOREIGN PATENT DOCUMENTS 61-236155  10/1986  Japan .................................... 257/370

*Primary Examiner*—Carl Whitehead, Jr.
*Assistant Examiner*—Jesse A. Fenty
*Attorney, Agent, or Firm*—Loeb & Loeb LLP

[57] ABSTRACT

Disclosed are a semiconductor integrated circuit device capable of including both a bipolar transistor and a MOS transistor while maintaining high performances of then both and a method of fabricating the device. On a p-type silicon substrate a plurality of n⁺-type regions are formed below the buried collector region of a bipolar transistor and the n-type well region of a MOS transistor. A plurality of p-type regions are formed below the isolation region of the bipolar transistor and the p-type well region of the MOS transistor. An epitaxial layer is formed on the substrate including these n⁺-type and p-type regions. This epitaxial layer forms element region layers having a bipolar transistor region and a MOS transistor region. The thickness of the layer of the bipolar transistor region is smaller than that of the layer of the MOS transistor region.

6 Claims, 9 Drawing Sheets

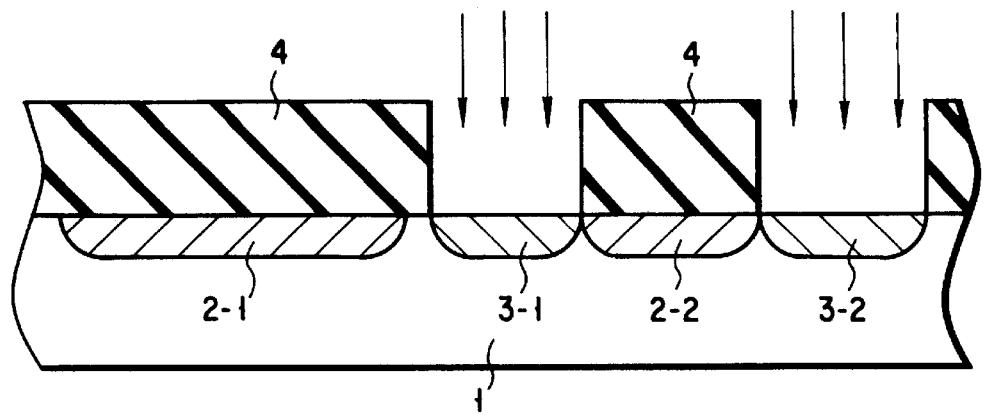
F I G. 10
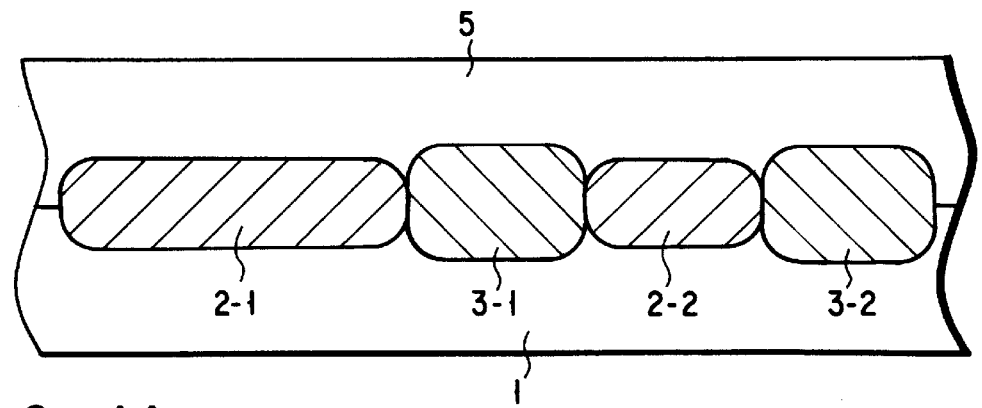
F I G. 11
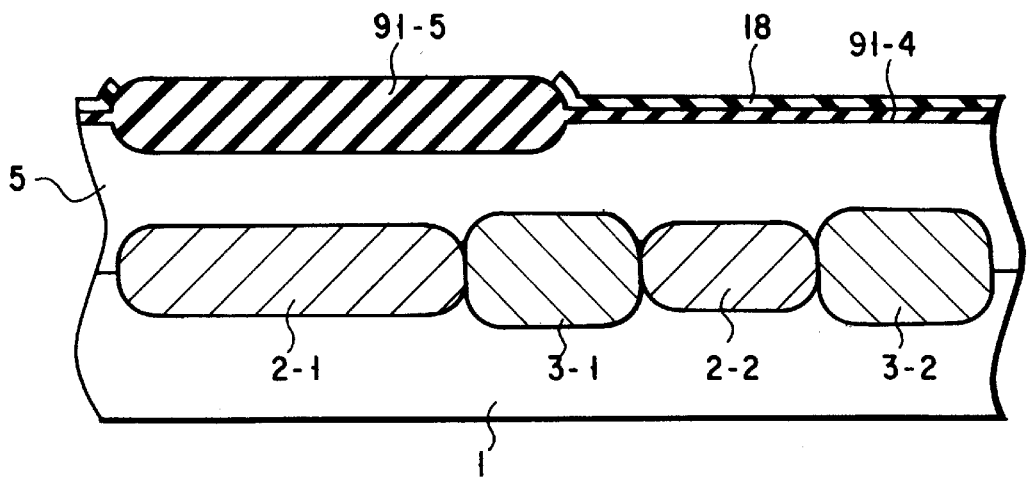
F I G. 12

BICMOS SEMICONDUCTOR INTEGRATED CIRCUIT DEVICE HAVING MOS TRANSISTOR AND BIPOLAR TRANSISTOR REGIONS OF DIFFERENT THICKNESS

BACKGROUND OF THE INVENTION

1. Field of the Invention

The present invention relates to a semiconductor integrated circuit device and, more particularly, to a so-called BiCMOS semiconductor integrated circuit device fabricated by forming both a bipolar transistor and a MOS transistor on a semiconductor substrate.

2. Description of the Related Art

FIGS. 1 to 5 are sectional views showing the steps of a method of fabricating a conventional BiCMOS integrated circuit in order. First, as shown in FIG. 1, n$^+$-type regions 2 in p-type substrate are formed in portions below a buried collector region of a bipolar transistor and an n-type well region of a MOS transistor. Generally, these regions are formed by solid-phase diffusion of As and Sb. A mask pattern of a resist film 4 is formed, and p-type regions 3 are selectively formed by ion implantation in portions below an isolation region of the bipolar transistor and a p-type well region of the MOS transistor.

In FIG. 2, epitaxial growth is performed to form an n-type epitaxial layer 5 with a low impurity concentration. In FIG. 3, an n-type region (n-type well region) 7 is formed in the epitaxial layer 5 above the n$^+$-type region 2 in the MOS transistor region. To decrease the collector resistance, a deep n-type region 8 reaching the buried collector region is formed. P-type regions 6 are formed in the epitaxial layer 5 above the p-type regions 3. These regions 6 form a p-type well region in the MOS transistor region and electrically isolate the bipolar transistor in the isolation region.

In FIG. 4, an oxide film 91 is formed by LOCOS (Local Oxidation of Silicon) to perform element isolation. An impurity is selectively doped into a portion serving as a channel of the MOS transistor by ion implantation, and the impurity profile is so controlled as to obtain a desired threshold. A gate oxide film 92 and gate electrodes 11 are formed. N-type impurity regions 12 are selectively formed by ion implantation in regions serving as the source and the drain of an n-channel MOS transistor and in a region serving as the collector contact of the bipolar transistor. Analogously, p-type impurity regions 13 are selectively formed by ion implantation in regions serving as the source and the drain of a p-channel MOS transistor and in a region serving as the base contact of the bipolar transistor. A low-doped shallow p-type impurity region 14 is formed as a base region on the surface of the epitaxial layer 5 above the buried collector of the bipolar transistor by using ion implantation.

In FIG. 5, an oxide film 93 is formed as a first insulating interlayer on the entire surface of the device. This oxide film 93 is selectively removed only from an emitter formation region of the bipolar transistor to thereby form a contact hole. A first interconnecting line 16 is formed by using polysilicon. An n-type impurity is doped into the polysilicon by using ion implantation and activated by some appropriate heating step. At the same time, the impurity in the polysilicon is diffused by solid phase into the emitter formation region of the bipolar transistor through the contact hole, thereby forming an n-type impurity region (emitter) 15. As (arsenic) is generally used as this impurity.

An oxide film 94 is formed as a second insulating interlayer on the entire surface of the device. The first and the second insulating interlayers (93 and 94) are removed only from contact regions, and second interconnecting lines 17 are formed in these regions by using a conductive material. Although an oxide film 95 covering the interconnecting lines 17 is finally formed in FIG. 5, third and fourth insulating interlayers and third and fourth interconnecting lines are subsequently formed where necessary. After all these interconnecting lines are formed, the surface is covered with an SiN film as a protective film to complete the device.

The characteristic features of the above device are as follows. Since the n-type epitaxial layer 5 with a low impurity concentration is sandwiched between the p-type impurity region 14 as the base region and the n$^+$-type region 2 as the collector region, the junction capacitance between the base and the collector can be decreased. This is important for a high-speed operation of the bipolar transistor. Also, since the buried layer 2 or 3 with a high impurity concentration is formed below the well region of the MOS transistor, the impurity concentration of the well can be decreased while a good latch-up resistance is maintained. Consequently, the junction capacitance between the source drain and the well of the MOS transistor can be decreased.

In the fabrication method as described above, the growth temperature of the epitaxial layer 5 is as high as 1000° C. or higher. Accordingly, the impurity in the highly doped buried layer 2 or 3 diffuses in the direction of film thickness of the epitaxial layer 5 (FIG. 2). If the film thickness of the epitaxial layer 5 is small, therefore, the profile near the channel of the MOS transistor may vary. This is particularly a problem in the n-channel MOS transistor because the p-type region 3 using boron (B) with a high diffusing capability influences the p-type well region.

The above phenomenon will be described in detail below by using mathematical expressions. When the diffusion of the impurity from the buried layer is taken into consideration, the concentration distribution of the impurity in the epitaxial layer can be expressed as follows (equation (1)). The second term of this equation indicates the diffusion of the impurity from the buried layer.

$$C_{T(x)} = \frac{N_{EPI}}{2} \left[ erfc\left( \frac{x-T}{2\sqrt{D_{EPI} t}} \right) + \right. \tag{1}$$
$$\left. \exp\left( \frac{vx}{D_{EPI}} \right) \cdot erfc\left( \frac{x+T}{2\sqrt{D_{EPI} t}} \right) \right] +$$
$$\frac{C_1}{2} \left[ 1 + erf\left( \frac{x-T}{2\sqrt{D_1 t}} \right) \right]$$

$C_{T(x)}$: the total impurity concentration in the epitaxial layer.

$C_1$: the impurity concentration of the heavily doped impurity layers of the first and second conductivity types.

$D_1$: the diffusion coefficient of the impurities in the heavily doped impurity layers of the first and second conductivity types at the temperature of epitaxial growth.

$D_{EPI}$: the diffusion coefficient of the impurity doped into the epitaxial layer at the temperature of epitaxial growth.

$N_{EPI}$: the initial concentration of the impurity doped into the epitaxial layer.

t: the time required for epitaxial growth.

v: the epitaxial growth velocity.

erf[ ]: an error function.
erfc[ ]: a complementary error function.
T: the thickness (=vt) of the epitaxial layer.
x: the depth from the surface of the epitaxial layer.
By using the above equation, the concentration of only the impurity diffused from the buried layer can be expressed as follows (equation (2)).

$$C_{(x)} = \frac{C_1}{2} \left[ 1 + erf\left( \frac{x-T}{2\sqrt{D_1 t}} \right) \right] \quad (2)$$

$C_{(x)}$: the concentration of the impurities, diffused from the heavily doped impurity layers of the first and second conductivity types, in the epitaxial layer of the second conductivity type.

The impurity concentration on the surface of the epitaxial layer, i.e., near the channel of the MOS transistor changes due to the impurity diffusion from the buried layer, and as a consequence the threshold of the MOS transistor varies. FIG. 6 shows the way the impurity in the buried layer 2 or 3 with a high impurity concentration diffuses in the direction of film thickness of the epitaxial layer 5. The threshold of the MOS transistor is expressed as follows.

$$V_{th} = V_{FB} + \phi_F - \frac{Q_{BD}}{C_{OX}} \quad (3)$$

$C_{OX}$: the gate capacitance.
$V_{FB}$: the flat band voltage.
$\phi_F$: the Fermi potential.
$Q_{BD}$: the total amount of the impurities present within the depletion layer (near the channel).
$V_{th}$: the threshold voltage of the MOS transistor.

Accordingly, the change in the threshold due to the diffusion of the impurities from the buried layers is expressed as follows.

$$\Delta V_{th} = -\frac{\Delta Q_{BD}}{C_{OX}} \quad (4)$$

$$\Delta Q_{BD} = \int_0^{x_{dmax}} C(x)dx \quad (5)$$

$x_{dmax}$: the maximum width of the depletion layer of the MOS transistor.
$\Delta Q_{BD}$: the total change amount of the impurities within the depletion layer near the channel caused by the diffusion of the impurities from the first and the second heavily doped impurity layers.
$\Delta V_{th}$: the change amount of $V_{th}$ caused by the change in the impurity concentration near the channel.

It is evident from equations (2), (3), (4), and (5) that when the film thickness T of the epitaxial layer 5 is small, the effects of becoming C(x) in the neighborhood of channel larger are that $\Delta Q_{BD}$ increases and largely changes the threshold voltage. A threshold variation like this is undesirable in respect of device design and hence must be minimized. For example, to decrease the threshold variation caused by the above phenomenon to 10% or less of the initial threshold, it is necessary to set the film thickness T of the epitaxial layer so that equation (6) below holds.

$$\left| \frac{\Delta V_{th}}{V_{th}} \right| \leq 0.1 \quad (6)$$

To solve this problem, the epitaxial layer 5 must be grown to have a large enough film thickness (e.g., 1.2 μm or larger).

However, if this film thickness is applied to the epitaxial layer 5 of the bipolar transistor, the width of the n-type lightly doped region of the lightly doped collector region of the epitaxial layer 5 between the base and the collector regions increases to be larger than the width necessary to decrease the junction capacitance. Since, the lightly doped collector region of an excess high-resistance epitaxial layer exists, the collector resistance of the bipolar transistor is increased, and this hinders a high-speed operation in the high injection region.

The above problem can also be considered as follows by using mathematical expressions. FIG. 7 shows the concentration profile of the bipolar transistor in the direction of depth of the substrate. The collector in a portion in contact with the base is the epitaxial layer 5 with a low concentration. Equation (7) expresses the junction capacitance between the base and the collector. Equation (7) shows that the junction capacitance can be decreased when the impurity concentration in the epitaxial layer is low.

$$C_J = \sqrt{\frac{q\epsilon_s}{2} \cdot \frac{N_B N_{EPI}}{N_B + N_{EPI}} \left( \frac{1}{V_{bi} + V_{BC}} \right)} \quad (7)$$

$C_J$: the junction capacitance between the base and the collector.
q: the elementary charge.
$\epsilon_S$: the dielectric constant of silicon.
$V_{bi}$: the diffusion potential.
$N_{EPI}$: the impurity concentration in the epitaxial layer.
$N_B$: the impurity concentration in the base region.
$V_{BC}$: the voltage between the base and the collector.

Equation (8) below expresses the width of the depletion layer between the base and the collector. When the impurity concentration in the epitaxial layer is low, the depletion layer widens. Equation (8) shows that this decreases the junction capacitance between the base and the collector.

$$W = \sqrt{\frac{2\epsilon_s}{q} \left( \frac{N_B + N_{EPI}}{N_B N_{EPI}} \right)(V_{bi} + V_{BC})} = \frac{\epsilon_s}{C_J} \quad (8)$$

W: the width of the depletion layer between the base and the collector.

In an actual operating range, however, $V_{BC}$ is not higher than power supply voltage $V_{CC}$ ($V_{BC} \leq V_{CC}$), and so the width of the depletion layer has an upper limit indicated by equation (9) below.

$$W_{max} = \sqrt{\frac{2\epsilon_s}{q} \left( \frac{N_B + N_{EPI}}{N_B N_{EPI}} \right)(V_{bi} + V_{CC})} \quad (9)$$

$W_{max}$: the maximum width of the depletion layer between the base and the collector.
$V_{CC}$: the power supply voltage.

If, therefore, the film thickness T of the epitaxial layer is too large and the depth of the lightly doped collector region of the epitaxial layer is larger than the maximum width of the depletion layer, a high-resistance epitaxial layer region X as shown in FIG. 7 exists. Accordingly, the collector resistance increases as indicated by equations (10), (11), and (12) below.

$$\Delta Rc = \frac{1}{q\mu_n N_{EPI}} [x_1 - (x_B + x_{nmax})] \quad (10)$$

$$C(x_1) = \frac{C_1}{2}\left[1 + erf\left(\frac{x_1 - T}{2\sqrt{D_1 t}}\right)\right] = N_{EPI} \quad (11)$$

$$x_{nmax} = \sqrt{\frac{2\varepsilon_s N_B(V_{bi} + V_{CC})}{qN_{EPI}(N_B + N_{EPI})}} \quad (12)$$

$\Delta R_C$: the increase in the collector resistance due to the existence of the epitaxial layer region.

$\mu_n$: the electron mobility in silicon.

$C_{(x)}$: the concentration of the impurities, diffused from the heavily doped impurity layers of the first and the second conductivity types, in the epitaxial layer of the second conductivity type.

$x_1$: the depth in the substrate at which the concentration of the impurities, diffused from the heavily doped impurity layers of the first and the second conductivity types, in the epitaxial layer of the second conductivity type is equal to the impurity concentration in the epitaxial layer.

$x_B$: the junction depth in the base region.

$x_{nmax}$: the maximum width of the depletion layer extending toward the collector.

$C_1$: the impurity concentration in the heavily doped impurity layers of the first and the second conductivity types.

$D_1$: the diffusion coefficient of the impurities in the heavily doped impurity layers of the first and the second conductivity types at the temperature of epitaxial growth.

t: the time required for epitaxial growth.

erf[ ]: an error function.

T: the thickness of the epitaxial layer.

x: the depth from the surface of the epitaxial layer.

Equations (13), (14), and (15) below indicate a cutoff frequency $f_T$ of the bipolar transistor. It can be understood from these equations that an increase in the collector resistance caused by too large a film thickness of the epitaxial layer decreases $f_T$.

$$f_T = \frac{1}{2\pi\tau_{EC}} \quad (13)$$

$$\tau_{EC} = \tau_E + \tau_B + \tau_X + \tau_C \quad (14)$$

$$\tau_C = R_C C_J \quad (15)$$

$f_T$: the cutoff frequency $\tau_{EC}$: the signal transmission time between the emitter and the collector.

$\tau_E$: the charging time of the emitter depletion layer.

$\tau_B$: the base transit time or the base charging time.

$\tau_X$: the transit time of the collector depletion layer.

$\tau_C$: the collector charging time.

$R_C$: the collector resistance.

To prevent the increase of the collector resistance, it is only necessary to decrease the film thickness of the epitaxial layer so that no the lightly doped collector region of high-resistance epitaxial layer exists. However, as illustrated in FIG. 8, the depletion layer does not extend to $x_{nmax}$ any longer if an upper end $x_1$ of the highly doped buried layer region is positioned above the maximum depletion layer extending toward the collector. That is, when $$x_B + x_{nmax} > x_1 \quad (16)$$

holds, a maximum depletion layer width $W_{max}'$ is decreased as follows (equation (17)).

$$W_{max} - W_{max}' = x_{nmax} - (x_1 - x_B) > 0 \quad (17)$$

If this is the case, although the collector resistance does not increase, the collector capacitance increases as indicated by equation (18) below, and this decreases $f_T$.

$$\frac{C_J'}{C_J} = \frac{W_{max}}{W_{max}'} > 1 \quad (18)$$

$C_J'$: the junction capacitance between the base and the collector when the extension of the depletion layer is restricted.

To improve the performance of the bipolar transistor, therefore, it is necessary to optimize the film thickness T of the epitaxial layer as indicated by equation (19) below.

$$x_1 = x_B + x_{nmax} \quad (19)$$

Since, however, the optimum film thickness indicated by the above equation is usually smaller than the necessary film thickness of the MOS transistor, it is difficult to optimize the two film thicknesses at the same time.

This problem does not arise if the buried layers, i.e., the n-type region 2 and the p-type region 3 are not formed below the MOS transistor. However, realizing a retrograde structure without forming any buried layer requires high energy ion implantation. This degrades the characteristics of a MOS transistor due to defects occurring in an epitaxial layer during the high energy ion implantation. Also, if no retrograde structure is used, it is necessary to increase the impurity concentration in a well in order to ensure a high latch-up resistance. Consequently, the junction capacitance between the source drain and the well cannot be decreased, and this is an obstacle to a high-speed operation of the MOS transistor.

It is possible to decrease the thickness of the epitaxial layer 5 by deeply forming the p-type impurity region 14 as the base region of the bipolar transistor. However, it is also important to minimize the thickness of the base in order to achieve high performance of the bipolar transistor. Therefore, this countermeasure leading to an increase of the base thickness cannot be performed.

In addition, the temperature of epitaxial growth can be lowered to control the diffusion of the buried regions 2 and 3. However, if the temperature is lowered, the quality of the epitaxial layer degrades or the productivity decreases due to the low growth rate. Alternatively, the impurity concentrations in the buried regions 2 and 3 can be decreased. However, if the impurity concentrations in these regions 2 and 3 are decreased, the collector resistance rises and this increases the series resistance of the bipolar transistor.

In the MOS transistor, it is also possible to cancel variations in the profile caused by the diffusion of the buried regions 2 and 3 by well increasing the channel ion implantation amount. However, this increases the junction capacitance between the source drain and the well, or the large ion implantation amount deepens (raises) the threshold of the MOS transistor. These influences are disadvantageous to a low-voltage operation and a high-speed operation.

SUMMARY OF THE INVENTION

The conventional methods have the drawback that it is difficult to simultaneously improve the performances of both a bipolar transistor and a MOS transistor since an epitaxial layer with a uniform thickness is used in the two transistors.

The present invention has been made in consideration of the above situation and its object is to provide a semiconductor integrated circuit device in which both a bipolar transistor and a MOS transistor can be fabricated while high performances of the two transistors are maintained, and a method of fabricating the device.

The semiconductor integrated circuit device of the present invention comprises an impurity region of a second conductivity type selectively formed on a semiconductor substrate of a first conductivity type, and an element region layer formed on the semiconductor substrate including the impurity region and having a bipolar transistor region and a MOS transistor region, wherein in the element region layer, the layer thickness of the bipolar transistor formation region is made different from the layer thickness of the MOS transistor formation region.

That is, both the bipolar transistor and the MOS transistor can be fabricated while their high performances are maintained because the thickness of the element region layer (epitaxial layer) of the bipolar transistor is made different from the thickness of the element region layer of the MOS transistor.

The method of fabricating the semiconductor integrated circuit device of the present invention comprises the steps of forming a buried region by using an impurity of a second conductivity type selectively formed on a semiconductor substrate of a first conductivity type, growing an epitaxial layer of the second conductivity type having a lower impurity concentration than a concentration of the impurity of the second conductivity type on the semiconductor substrate, selectively converting a portion of the epitaxial layer of the second conductivity type into an oxide film, removing the oxide film, forming a bipolar transistor by using the portion of the epitaxial layer, whose thickness is decreased by the removal of the oxide film, as a first element region, and forming a MOS transistor by selectively using the rest of the epitaxial layer as a second element region.

Another method of fabricating the semiconductor integrated circuit device of the present invention makes use of the step of selectively, anisotropically etching away a portion of the epitaxial layer of the second conductivity type, instead of selectively converting a portion of the epitaxial layer into an oxide film and removing this oxide film. The method is characterized by comprising the steps of forming a bipolar transistor by using the portion of the epitaxial layer, whose thickness is decreased by the etching, as a first element region, and forming a MOS transistor by selectively using the rest of the epitaxial layer as a second element region.

In these methods of the present invention, different epitaxial layer film thicknesses can be chosen for the bipolar transistor and the MOS transistor. This contributes to optimum device designs of the bipolar transistor and the MOS transistor, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 is a first sectional view showing one step of a method of fabricating the BiCMOS integrated circuit in FIG. 9;

FIG. 11 is a second sectional view showing another step of the method of fabricating the BiCMOS integrated circuit in FIG. 9;

FIG. 12 is a third sectional view showing still another step of the method of fabricating the BiCMOS integrated circuit in FIG. 9;

DETAILED DESCRIPTION OF THE PREFERRED EMBODIMENTS

Figure 9:
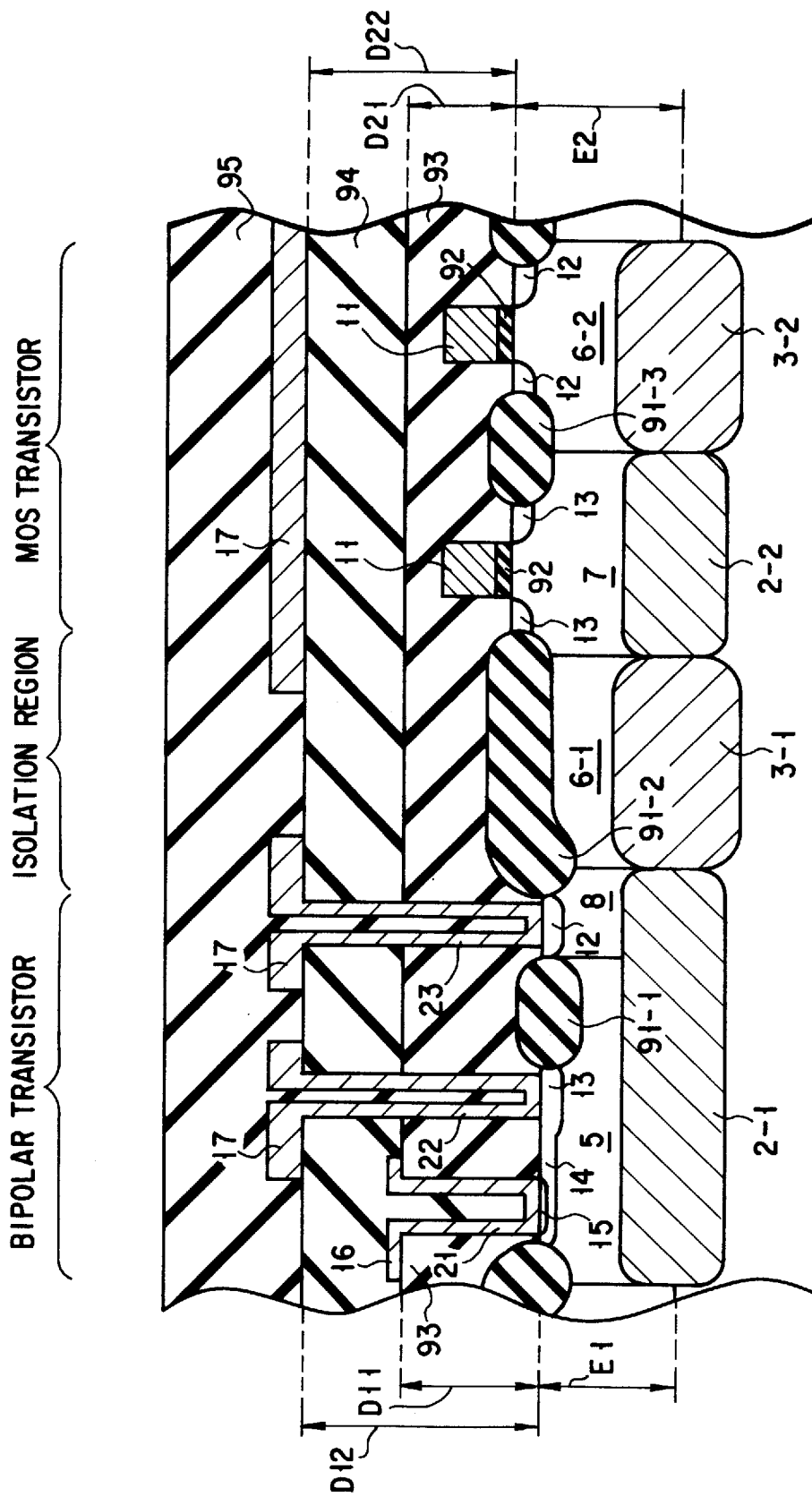
FIG. 9 is a sectional view showing the structure of a BiCMOS integrated circuit having both an NPN bipolar transistor and a CMOS transistor according to the first embodiment of the present invention.

FIG. 9 is a sectional view showing the structure of a BiCMOS integrated circuit including both an NPN transistor and a CMOS transistor according to the first embodiment of the present invention. On a p-type silicon substrate 1, n$^+$-type regions 2-1 and 2-2 are formed below a buried collector region of the bipolar transistor and an n-type well region of the MOS transistor. P-type regions 3-1 and 3-2 are formed below an isolation region of the bipolar transistor and a p-type well region of the MOS transistor.

An epitaxial layer 5 is formed on the substrate including these regions 2-1, 3-1, 2-2, and 3-2. This epitaxial layer 5 forms element region layers E1 and E2 having a bipolar transistor region and a MOS transistor region, respectively, and the thicknesses of these region layers are different. That is, as shown in FIG. 9, the thickness of the bipolar transistor region layer E1 is smaller than that of the MOS transistor region layer E2.

In the bipolar transistor region, a p-type impurity region 14 is formed as a base region, an n-type impurity region 15 is formed as an emitter region in the p-type impurity region 14, and a p-type impurity region 13 is formed as a base contact. An n-type impurity region 12 is formed as a collector contact region apart from the p-type impurity region 14 with an oxide film 91-1 between them. This region 12 is formed in a deep n-type region 8 reaching the buried collector region.

A p-type region 6-1 is formed on the p-type region 3-1 in the isolation region, and an oxide film 91-2 is formed on the p-type region 6-1. This isolation region includes the boundary which makes the essential thicknesses of the element region layers E1 and E2 different.

In the MOS transistor region, an n-type region 7 is formed as an n-type well region in the epitaxial layer 5 above the $n^+$-type region 2-2. On the surface of this n-type well region, p-type impurity regions 13 are formed apart from each other with a gate oxide film 92 and a gate electrode 11 between them (a p-channel MOS transistor). Also, a p-type region 6-2 is formed as a p-type well region in the epitaxial layer 5 above the p-type region 3-2. On the surface of this p-type well region, n-type impurity regions 12 are formed apart from each other with the gate oxide film 92 and the gate electrode 11 between them (an n-channel MOS transistor). These p- and n-channel MOS transistors are formed apart from each other with an oxide film 91-3 between them on the surface of the element region layer (E2).

An oxide film 93 is formed as a first insulating interlayer on the entire surface of the device. A first interconnecting line 16 is formed on the oxide film 93. This interconnecting line 16 is connected to the n-type impurity region 15 as an emitter formation region of the bipolar transistor through a contact hole 21.

An oxide film 94 is formed as a second insulating interlayer on the oxide film 93 including the interconnecting line 16. Second interconnecting lines 17 are formed on the oxide film 94. These second interconnecting lines 17 are connected to the p-type impurity region 13 as the base contact and the n-type impurity region 12 as the collector contact of the bipolar transistor through contact holes 22 and 23, respectively. The second interconnecting lines 17 can also be connected to necessary contacts of the MOS transistor in another section (not shown). An oxide film 95 is formed as a third insulating interlayer on the oxide film 94 including the interconnecting line 17.

In the above structure, the thickness of the element region layer (epitaxial layer) of the bipolar transistor is different from that of the element region layer of the MOS transistor. This realizes optimum device designs of these respective transistors. That is, in the bipolar transistor region the thickness of the element region layer is so set as to decrease both the junction capacitance and the collector resistance. In the MOS transistor region the thickness of the element region layer is so set as not to vary the profile near the channel. Consequently, the performances of the two devices are simultaneously improved.

FIGS. 10 to 13 are sectional views showing the steps of a fabrication method of the BiCMOS integrated circuit in FIG. 9 in order. First, as shown in FIG. 10, on a 4 to 6 Ω cm p-type silicon substrate 1, $n^+$-type regions 2-1 and 2-2 are formed below a buried collector region of a bipolar transistor and an n-type well region of a MOS transistor. These regions are formed by a generally performed method such as solid phase diffusion of Sb. A mask pattern of a resist film 4 is formed, and p-type regions 3-1 and 3-2 are selectively formed by ion implantation in portions below an isolation region of the bipolar transistor and a p-type well region of the MOS transistor.

In FIG. 11, 0.1 to 1.0 Ω cm n-type epitaxial growth is performed to form an n-type epitaxial layer 5 with a low impurity concentration. The film thickness of the epitaxial layer more or less changes in accordance with the MOS transistor formation conditions. However, it is only necessary to set a thickness (e.g., an appropriate thickness of 1.2 μm or more) by which the diffusion of impurities from the regions 2-2 and 3-2 in the buried layer has no influence on the profile near the channel. The film thickness of the epitaxial layer can also be set in accordance with equation (6) described previously. It is more preferable to increase the thickness by 10 to 20% for the sake of safety when fluctuations of the process are taken into consideration.

In FIG. 12, selective oxidation is performed only in a region in which the bipolar transistor is formed. This selective oxidation is done as follows. For example, an oxide film 91-4 is formed by oxidizing the surface of the epitaxial layer 5 by a thickness of about 10 to 100 nm, and an SiN film 18 with a thickness of about 50 to 300 nm is formed by CVD. The SiN film 18 and the oxide film 91-4 are selectively removed only from the bipolar transistor formation region, thereby selectively exposing the epitaxial layer 5. Thereafter, an oxide film 91-5 is formed by oxidizing the entire surface.

To control the impurity diffusion from the buried regions 2-1, 2-2, 3-1, and 3-2, it is desirable that the temperature of the oxidation step be as low as possible (e.g., an $H_2O$ atmosphere at 800° C.). CVD is another method of forming the oxide film 91-4. Also, there is a method not using the SiN film 18. That is, an oxide film (91-4) about 50 to 500 nm thick is formed on the surface of the epitaxial layer 5 and selectively removed only from the bipolar transistor formation region. Thereafter, the oxide film 91-5 is formed by oxidizing the entire surface.

The oxidation amount of the epitaxial layer 5 in the bipolar transistor region is determined by the amount of silicon consumed before the film thickness of the epitaxial layer becomes an optimum one (e.g., a proper film thickness of 1.0 μm or less) for the formation of the bipolar transistor. The temperature of this oxidation also is desirably as low as possible.

Figure 1:
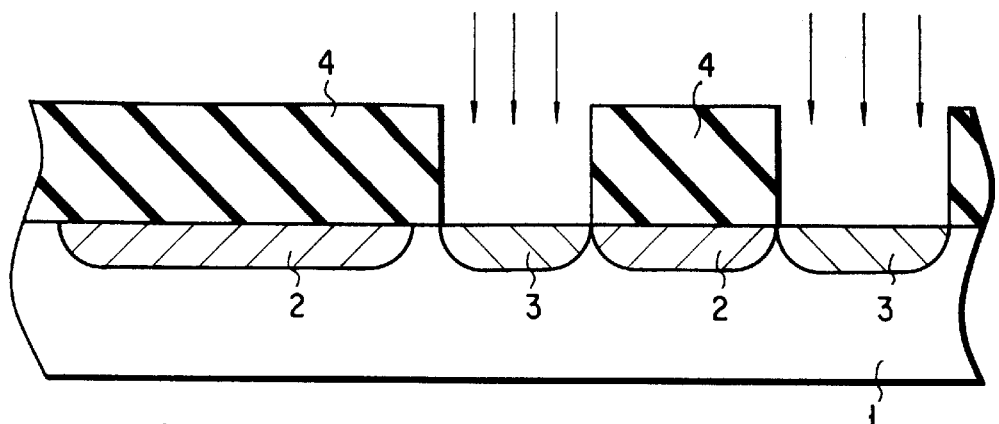
FIG. 1 is a first sectional view showing one step of a conventional BiCMOS integrated circuit fabrication method.
Figure 2:
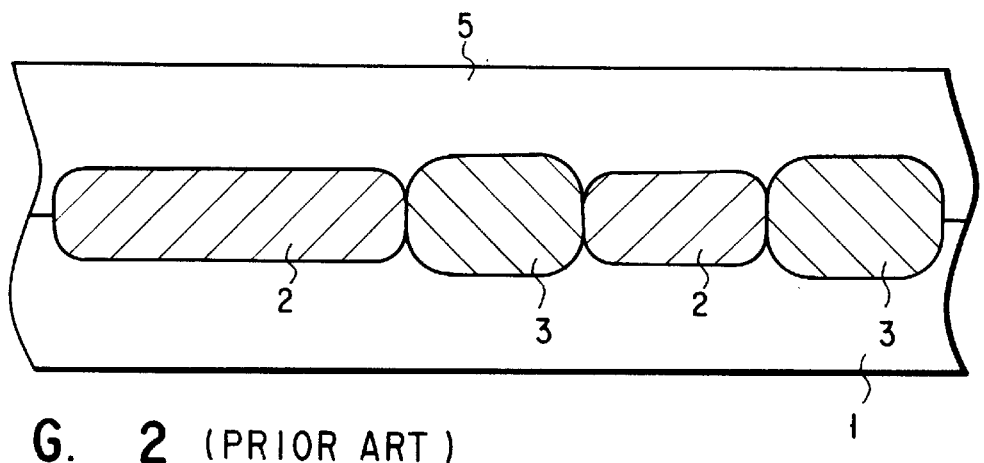
FIG. 2 is a second sectional view showing another step of the conventional BiCMOS integrated circuit fabrication method.
Figure 3:
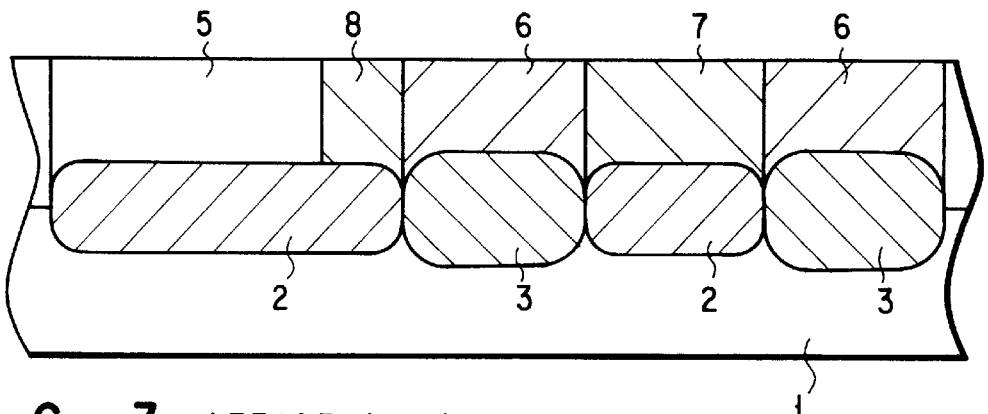
FIG. 3 is a third sectional view showing still another step of the conventional BiCMOS integrated circuit fabrication method.
Figure 4:
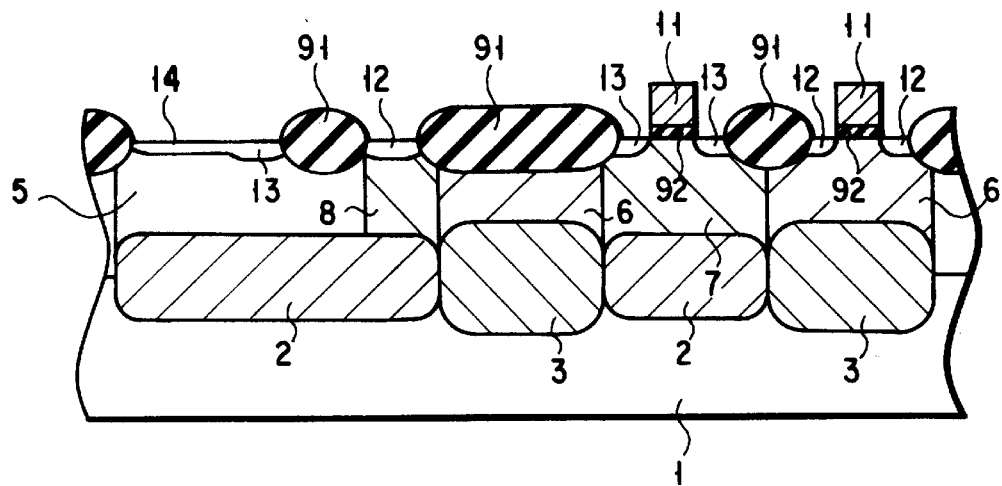
FIG. 4 is a fourth sectional view showing still another step of the conventional BiCMOS integrated circuit fabrication method.
Figure 5:
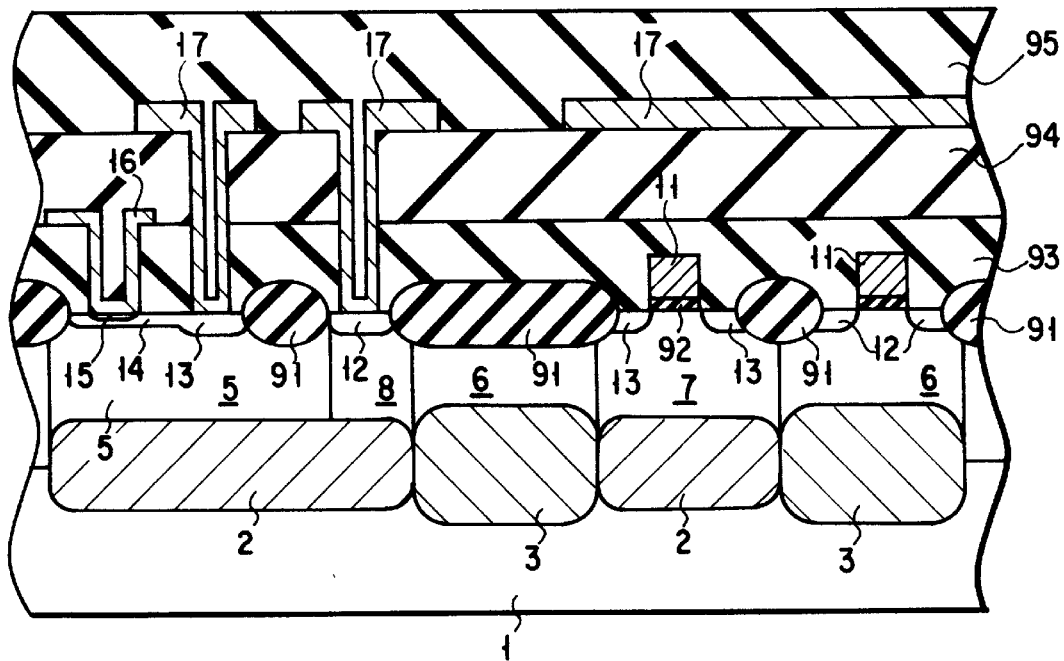
FIG. 5 is a fifth sectional view showing still another step of the conventional BiCMOS integrated circuit fabrication method.
Figure 6:
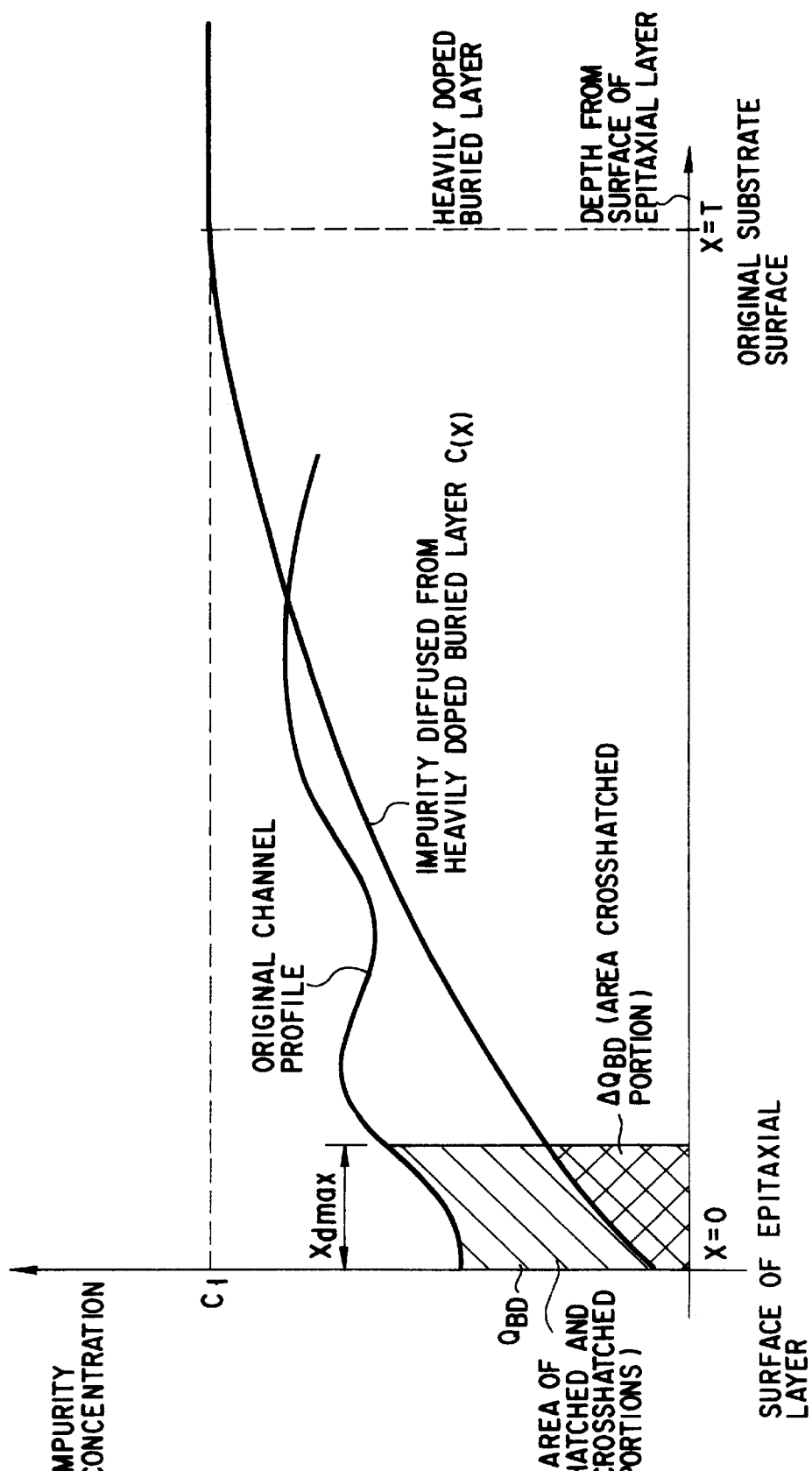
FIG. 6 is a graph showing the impurity concentration profile of a MOS transistor.
Figure 7:
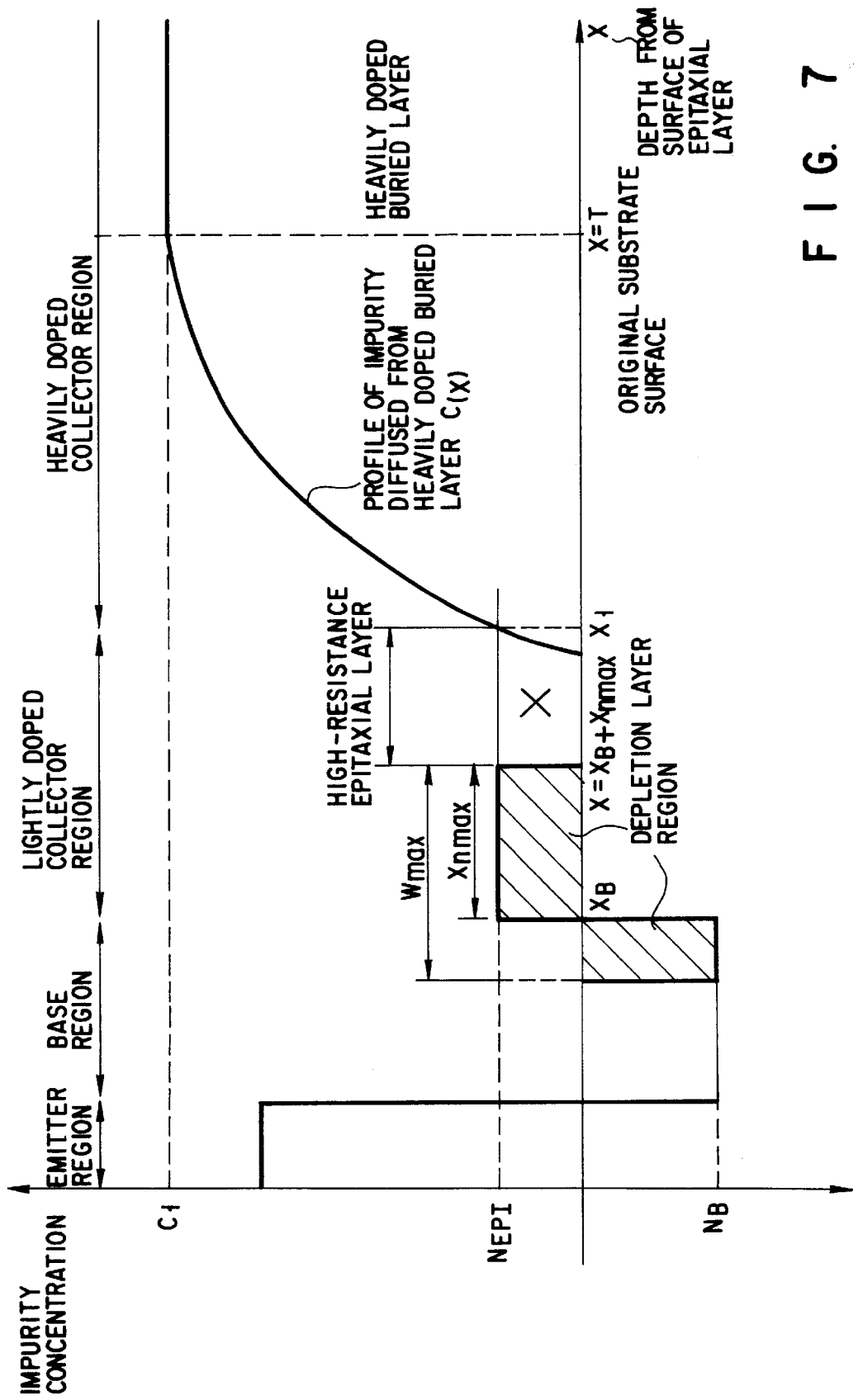
FIG. 7 is a graph showing the impurity concentration profile of a bipolar transistor when the film thickness of an epitaxial layer is large.
Figure 8:
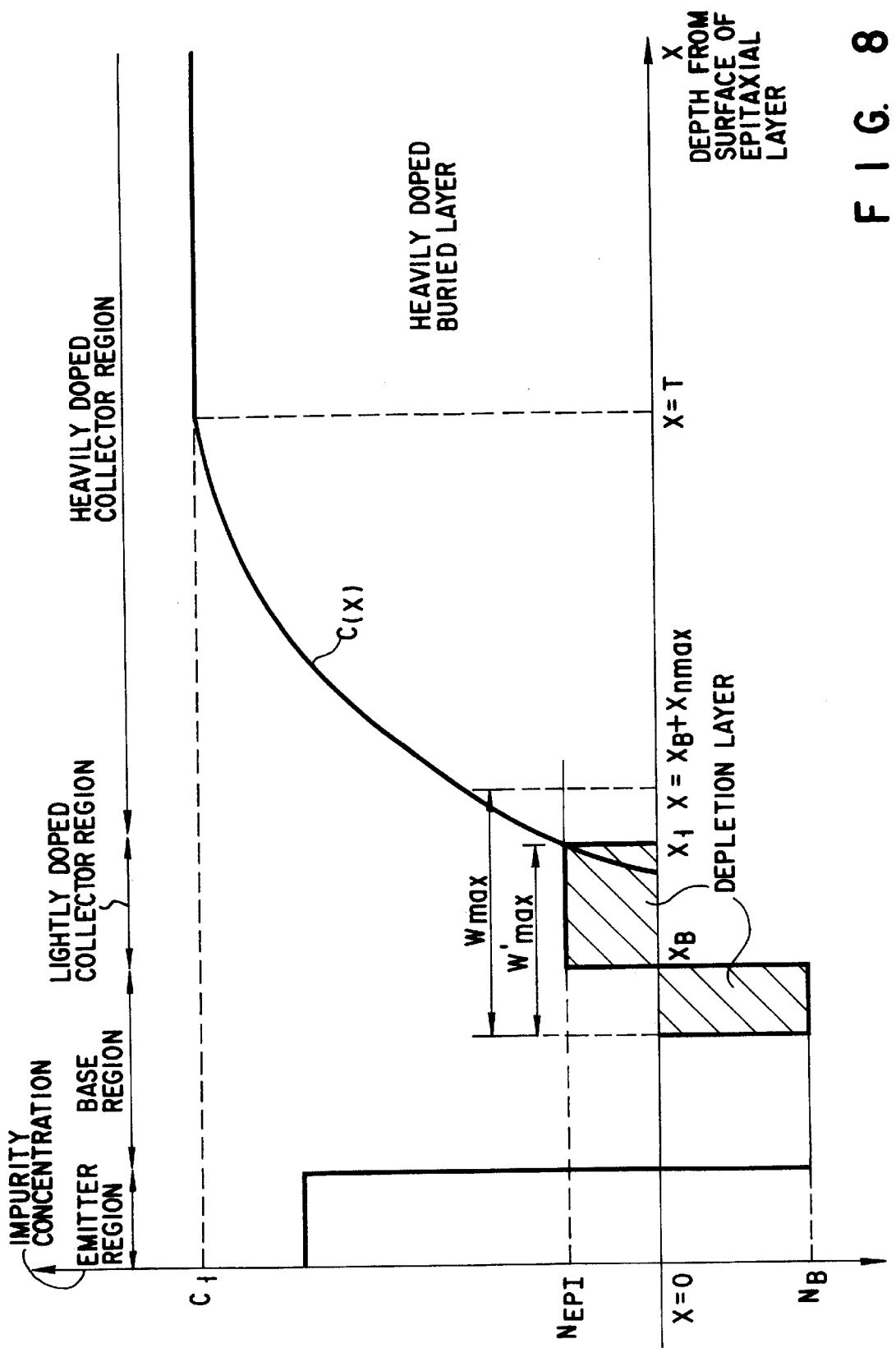
FIG. 8 is a graph showing the impurity concentration profile of a bipolar transistor when the film thickness of an epitaxial layer is small.

The oxidation amount can also be determined as follows. The film thickness of the epitaxial layer before the oxidation is so set as to be optimum for the MOS transistor. As described earlier, this film thickness is larger than the optimum epitaxial film thickness for the bipolar transistor. If the bipolar transistor is formed under the condition, the state shown in FIG. 7 results, leading to an increase in the collector resistance. To prevent this, it is only necessary to decrease the film thickness of the epitaxial layer by the width of the lightly doped collector region of a high-resistance epitaxial layer so that no such epitaxial layer exists. That is, an epitaxial layer ΔT consumed by the oxidation can be determined by equation (20) below.

$$\Delta T = x_1 - (x_B + x_{nmax}) \quad (20)$$

Figure 13:
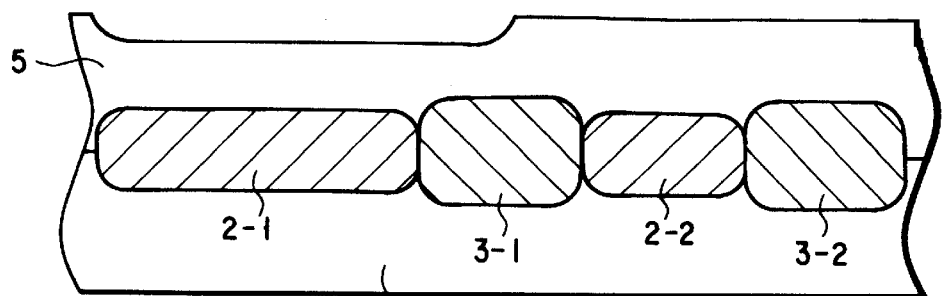
FIG. 13 is a fourth sectional view showing still another step of the method of fabricating the BiCMOS integrated circuit in FIG. 9.

Thereafter, as shown in FIG. 13, the oxide films 91-4 and 91-5 formed as described above are completely removed by some appropriate means such as $NH_4F$ wet etching. An n-type region 7 is formed as an n-type well region in the epitaxial layer 5 above the buried $n^+$-type region 2-2. A deep n-type region 8 reaching the buried collector region is formed to decrease the collector resistance. A p-type region well 6-2 is formed in the epitaxial layer 5 above the buried p-type region 3-2. At the same time, a p-type region 6-1 is formed on the p-type region 3-1 in the isolation region to electrically isolate the bipolar transistor. Element isolation is then performed by, e.g., the LOCOS (Local Oxidation of Silicon) element isolation method.

An impurity is selectively doped into the channel formation portion of the MOS transistor by using ion implantation, and the profile is so controlled as to obtain a desired threshold. A gate oxide film 92 and a gate electrode 11 are subsequently formed. N-type impurity regions 12 are selectively formed by using ion implantation in the source and the drain formation regions of the n-channel MOS transistor and the collector contact formation region of the bipolar transistor. Likewise, p-type impurity regions 13 are selectively formed by using ion implantation in the source and the drain formation regions of the p-type MOS transistor and the base contact formation region of the bipolar transistor. A low-doped shallow p-type impurity region 14 is formed as a base region by using ion implantation on the surface of the epitaxial layer 5 above the buried collector of the bipolar transistor.

An oxide film 93 is formed as a first insulating interlayer on the entire surface of the device and selectively removed only from the emitter formation region of the bipolar transistor, forming a contact hole. After then, a first interconnecting lines 16 are formed using by poly-silicon. An n-type impurity is doped into polysilicon by using ion implantation and activated by using some appropriate heating step. At the same time, the impurity in the polysilicon is diffused by solid phase into the emitter formation region of the bipolar transistor through the contact hole, thereby forming an n-type impurity region (emitter) 15. As (arsenic) is generally used as the impurity.

Thereafter, as shown in FIG. 9, an oxide film 94 is formed as a second insulating interlayer on the entire surface of the device. The first and the second insulating interlayers (93 and 94) are removed only from the contact regions, and second interconnecting lines 17 are formed by using a conductive material. Although an oxide film 95 covering the interconnecting lines 17 is finally formed in FIG. 9, third and fourth insulating interlayers and third and fourth interconnecting lines are subsequently formed if necessary. After all these interconnecting lines are formed, the surface is covered with an SiN film as a protective film to complete the device.

The selective oxidation and oxide film removal step for decreasing the film thickness of the epitaxial layer 5, the well region formation step, and the element isolation step can be performed in any arbitrary order. For example, it is possible to perform the element isolation, the selective oxidation and oxide film removal, and the well region formation in this order.

In the above method of the present invention, the substrate surface of the epitaxial layer in the bipolar transistor formation region is lower than other portions. Therefore, when CMP (Chemical Mechanical Polish) is used to planarize the insulting interlayers, as illustrated in FIG. 9, distances $D_1 1$ and $D_1 2$ between the interconnecting layers and the epitaxial substrate in the bipolar transistor formation region can be made longer than the corresponding distances (D21 and D22) in other portions, since the substrate surface of the epitaxial layer is low in the bipolar transistor formation region. As a consequence, the capacitance between each interconnecting layer and the substrate can be decreased, and this realizes a decreased parasitic capacitance of the bipolar transistor. This is very advantageous to increase the operating speed of the bipolar transistor.

Figure 14:
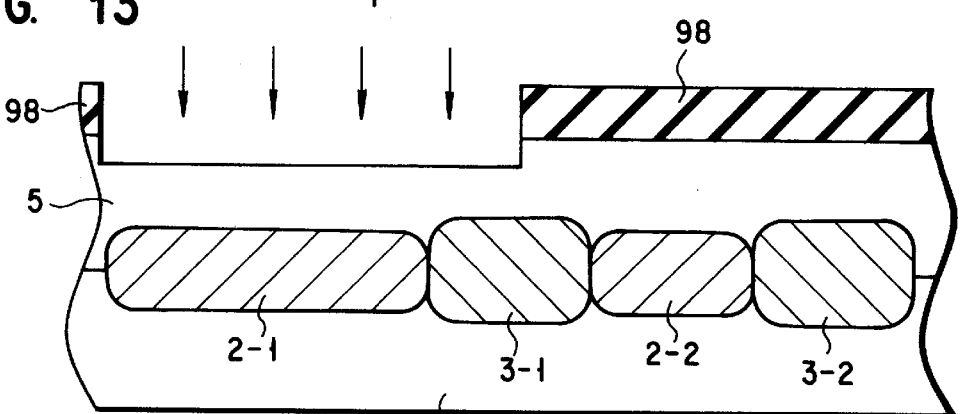
FIG. 14 is a sectional view showing a structure formed by using another fabrication step in the fabrication method shown in FIGS. 10 to 13.

FIG. 14 is a sectional view showing a structure formed by using another step in the method of fabricating the BiCMOS integrated circuit in FIG. 9. Instead of the step shown in FIG. 12, the epitaxial layer 5 in the bipolar transistor region is appropriately selectively etched. That is, in FIG. 14, as a means for selectively decreasing the film thickness of the epitaxial layer 5, a pattern is formed by using a proper mask material and silicon is anisotropically etched by RIE (Reactive Ion Etching). For example, an oxide film 98 with a thickness of about 800 to 1000 nm is formed on the surface of the epitaxial layer 5. The oxide film 98 is then selectively removed only from the bipolar transistor formation region, and RIE of silicon is performed by using the film as a mask material.

The etching method can also be isotropic etching of silicon performed by CDE (Chemical Dry Etching). Also, the mask material need not be the oxide film (98), i.e., any substance having selectivity to RIE or CDE of silicon can be used. Damages to the substrate (epitaxial layer 5) caused by RIE can be prevented by slightly oxidizing the surface (e.g., 800° C., oxidation by hydrochloric acid, 50 nm). This method realizes a substrate (epitaxial layer) in which the bipolar transistor region and the MOS transistor region have different thicknesses, as shown in FIG. 9. The film thickness ΔT of the epitaxial layer to be etched can also be determined in accordance with equation (20) presented earlier.

Figure 15:
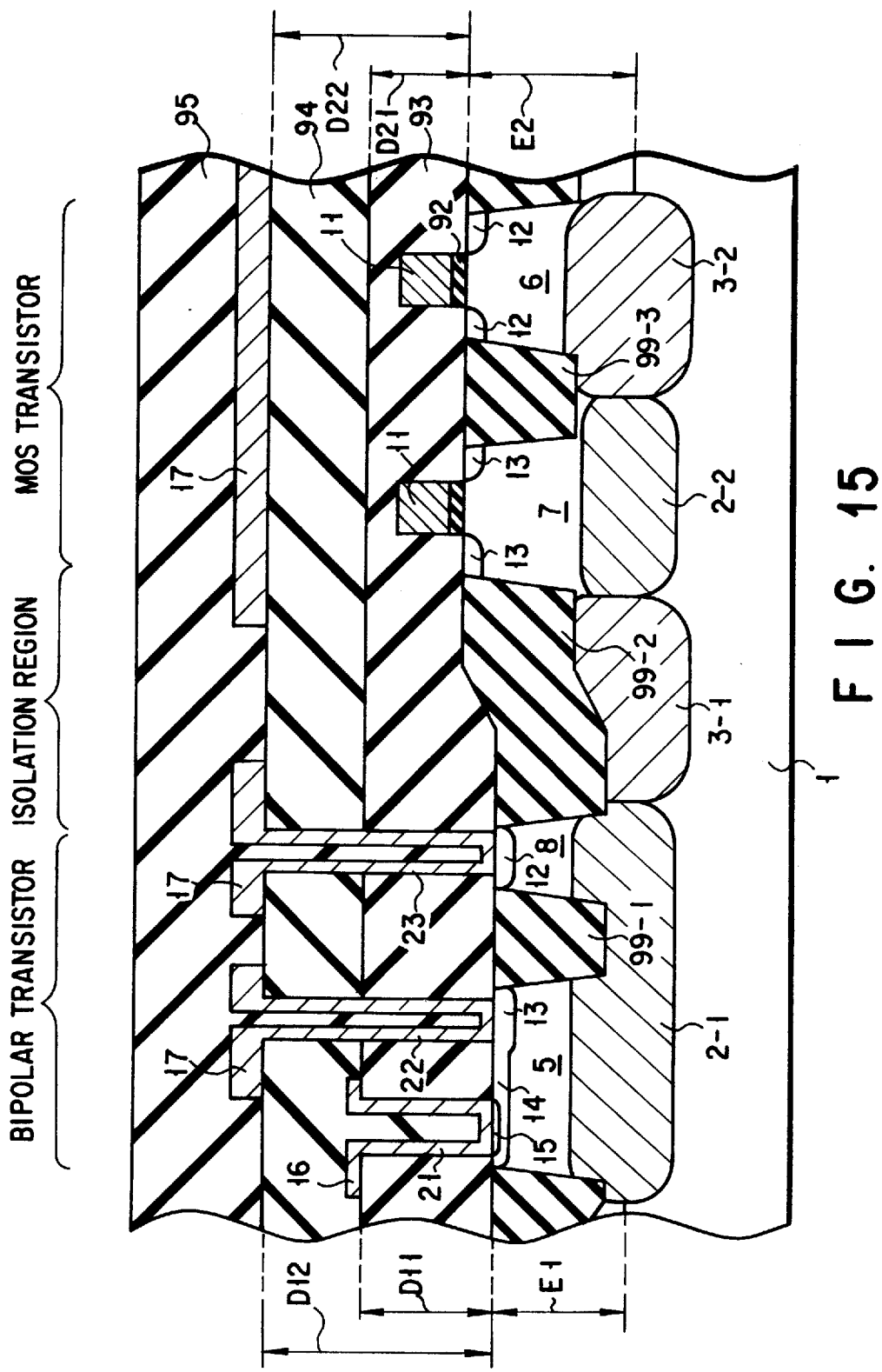
FIG. 15 is a sectional view showing the structure of a BiCMOS integrated circuit having both an NPN bipolar transistor and a CMOS transistor according to the second embodiment of the present invention.

FIG. 15 is a sectional view showing the structure of a BiCMOS integrated circuit including both an NPN bipolar transistor and a CMOS transistor according to the second embodiment of the present invention. The difference from the structure shown in FIG. 9 is the method of element isolation. That is, the structure shown in FIG. 15 uses trench element isolation.

On a p-type silicon substrate 1, $n^+$-type regions 2-1 and 2-2 are formed below a buried collector region of the bipolar transistor and an n-type well region of the MOS transistor. P-type regions 3-1 and 3-2 are formed below an isolation region of the bipolar transistor and a p-type well region of the MOS transistor.

An epitaxial layer 5 is formed on the substrate including these regions 2-1, 3-1, 2-2, and 3-2, and oxide films 99-1, 99-2, and 99-3 are formed as isolation regions in the epitaxial layer 5. That is, the oxide film 99-1 is formed in place of the oxide film 91-1 in FIG. 9, the oxide film 99-2 is formed in place of the oxide film 91-2 and the p-type region 6-1 in FIG. 9, and the oxide film 99-3 is formed in place of the oxide film 91-3 in FIG. 9.

Like in FIG. 9, element region layers E1 and E2 having a bipolar transistor region and a MOS transistor region are formed as element region substrates. The thicknesses of the two element region layers are different on the two sides of the oxide film 99-2 in the isolation region. That is, as shown in FIG. 15, the thickness of the bipolar transistor region layer E1 is smaller than that of the MOS transistor region layer E2. The rest of the structure is identical with that shown in FIG. 9 and a detailed description thereof will be omitted.

In the above structure, as in the structure shown in FIG. 9, the element region layer (epitaxial layer) of the bipolar transistor has a thickness different from the thickness of the element region layer of the MOS transistor. Accordingly, these two devices can be optimally designed independently of each other. Consequently, the performances of the two devices can be simultaneously improved.

Figure 16:
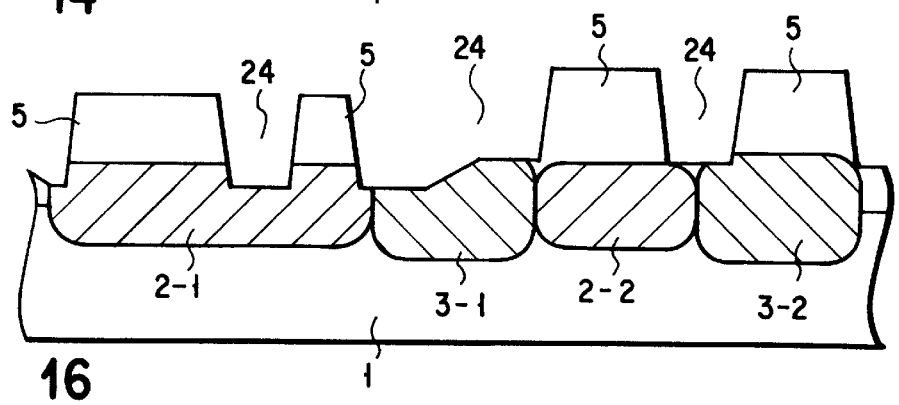
FIG. 16 is a first sectional view showing one step of a method of fabricating the BiCMOS integrated circuit in FIG. 15.
Figure 17:
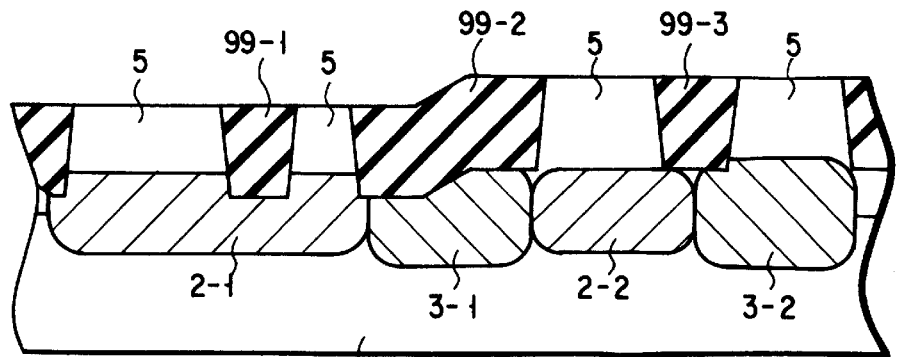
FIG. 17 is a second sectional view showing another step of the method of fabricating the BiCMOS integrated circuit in FIG. 15.

FIGS. 16 and 17 are sectional views showing the main steps of a method of fabricating the BiCMOS integrated circuit in FIG. 15 in order. The formation of the n$^+$-type regions 2-1 and 2-2 and p-type regions 3-1 and 3-2 on the p-type silicon substrate 1, the formation of the epitaxial layer 5, the selective oxidation of the epitaxial layer 5, and the removal of the oxide film are the same as in FIGS. 10 to 12 and a detailed description thereof will be omitted.

That is, the element region layer (epitaxial layer 5) having different thicknesses in the bipolar transistor region and the MOS transistor region are formed. In FIG. 16, a mask pattern in which a portion serving as an element isolation region is exposed is used to selectively remove the epitaxial layer 5 from the element isolation region by using RIE, thereby forming a trench 24.

In FIG. 17, the trench is buried with insulating films, e.g., the oxide films 99-1, 99-2, and 99-3 by using CVD or the like method, and the surface is planarized by etching back or polishing. Thereafter, the transistor elements are completed in accordance with the BiCMOS integrated circuit formation steps as described above, thereby obtaining the structure in FIG. 15.

In this method, it is possible to omit the heating step at 1000° C. for 5 to 8 hours necessary to perform element isolation by LOCOS in the structure shown in FIG. 9. The result is the advantage of being able to control the impurity diffusion in the n$^+$-type regions 2-1 and 2-2 and the p-type regions 3-1 and 3-2 as the buried layers.

In this structure of FIG. 15, as a means for selectively decreasing the film thickness of the epitaxial layer 5, it is naturally possible to form a pattern by using a proper mask material and perform anisotropic etching of silicon by using RIE, as in the structure shown in FIG. 14, or to perform isotropic etching of silicon by using CDE.

According to the present invention as has been described above, the thickness of an element region layer (epitaxial layer) of a bipolar transistor can be made different from that of an element region layer of a MOS transistor. Therefore, the performances of both the bipolar transistor and the MOS transistor can be expected to be improved. Consequently, it is possible to provide a semiconductor integrated circuit device which can optimize a BiCMOS integrated circuit and a method of fabricating the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
a semiconductor substrate of a first conductivity type;
a first impurity region of a second conductivity type selectively formed on said semiconductor substrate;
a second impurity region of the first conductivity type selectively formed on said semiconductor substrate;
a first epitaxial silicon layer of the second conductivity type formed on said first impurity region of the second conductivity type and having a lower impurity concentration than an impurity concentration of said first impurity region, said first epitaxial silicon layer having a bipolar transistor formation region and a first MOS transistor formation region;
a second epitaxial silicon layer of the first conductivity type formed on said second impurity region and having a lower impurity concentration than an impurity concentration of said second impurity region, said second epitaxial silicon layer having a second MOS transistor formation region; and
a bipolar transistor formed in said bipolar transistor formation region, a first MOS transistor having a channel of the second conductivity type formed in said first MOS transistor formation region, and a second MOS transistor having a channel of the first conductivity type formed in said second MOS transistor formation region,
wherein a thickness of said first epitaxial silicon layer within said bipolar transistor formation region is smaller than a thickness of said epitaxial layer within said first MOS transistor formation region and smaller than a thickness of said second epitaxial layer within said second MOS transistor formation region.

2. A semiconductor integrated circuit device comprising:
a semiconductor substrate of a first conductivity type;
a plurality of heavily doped impurity regions of the first conductivity type and a second conductivity type selectively formed on said semiconductor substrate and having a higher impurity concentration than an impurity concentration of said semiconductor substrate;
an isolation region formed on one of said impurity regions of the first conductivity type;
a MOS transistor element region including a first MOS transistor having a channel of the first conductivity type and a second MOS transistor having a channel of the second conductivity type formed on said impurity regions, a thickness of an epitaxial layer formed in said MOS transistor element region being a first thickness; and
a bipolar transistor element region formed on said impurity region, a thickness of an epitaxial layer formed in said bipolar transistor element region being a second thickness,
wherein the first thickness is larger than the second thickness.

3. A device according to claim 2, wherein letting T$_1$ be the first thickness, T$_1$ is determined in accordance with equations (C-1), (C-2), (C-3), and (C-4) so that a variation $\Delta V_{th}$ in a threshold voltage of a MOS transistor formed in said MOS transistor element region caused by impurities diffused from said impurity regions of the first and the second conductivity types is not more than 10% of a threshold voltage V$_{th}$ of said MOS transistor:

$$V_{th} = V_{FB} + \phi_F - \frac{Q_{BD}}{C_{OX}} \quad (C\text{-}1)$$

$$\Delta V_{th} = -\frac{\Delta Q_{BD}}{C_{OX}} \quad (C\text{-}2)$$

$$\Delta Q_{BD} = \int_0^{x_{dmax}} qC_{(x)}dx \quad (C\text{-}3)$$

$$C_{(x)} = \frac{C_1}{2} \left[ 1 + erf\left( \frac{x - T_1}{2\sqrt{D_1 t}} \right) \right] \quad \text{(C-4)}$$

x: a depth from a surface of said epitaxial layer, $x_{dmax}$: a maximum width of a depletion layer of said MOS transistor, $C_{OX}$: a gate capacitance, $V_{FB}$: a flat band voltage, $\phi_F$: a Fermi potential, q: an elementary charge, $c_{(x)}$: a concentration of the impurities, diffused from said heavily doped impurity regions of the first and the second conductivity types, in said epitaxial layer of the second conductivity type, $C_1$: an impurity concentration of said heavily doped impurity regions of the first and second conductivity types, $D_1$: a diffusion coefficient of impurities in said heavily doped impurity regions of the first and second conductivity types at a temperature of epitaxial growth, t: a time required for epitaxial growth, erf[ ]: an error function, $V_{th}$: a threshold voltage of said MOS transistor, $Q_{BD}$: a total amount of impurities present within the depletion layer (near a channel), $\Delta Q_{BD}$: a total change amount of impurities within the depletion layer near the channel caused by diffusion of the impurities from said heavily doped impurity regions of the first and second conductivity types, and $\Delta V_{th}$: a change amount of $V_{th}$ caused by a change in a impurity concentration near the channel.

4. A device according to claim 2, wherein the second thickness, $T_2$, of said bipolar transistor element region is determined in accordance with equations (C-5), (C-6), and (C-7) so that a product of a junction capacitance between a base and a collector and a collector resistance is minimized:

$$T_2 - T_1 = x_B + x_{nmax} - x_1 \quad \text{(C-5)}$$

$$x_{nmax} = \frac{\sqrt{2\epsilon_S N_B (V_{bi} + V_{CC})}}{qN_{EPI}(N_B + N_{EPI})} \quad \text{(C-6)}$$

$$C_{(x1)} = \frac{C_1}{2}\left[ 1 + erf\left( \frac{x_1 - T_1}{2\sqrt{D_1 t}} \right) \right] = N_{EPI} \quad \text{(C-7)}$$

$T_1$: the first thickness, $\epsilon_S$: a dielectric silicon, $C_1$: an impurity concentration of said heavily doped impurity regions of the first and second conductivity types, $D_1$: a diffusion coefficient of impurities in said heavily doped impurity regions of the first and second conductivity types at a temperature of epitaxial growth, t: a time required for epitaxial growth, erf[ ]: an error function, $V_{bi}$: a diffusion potential, $V_{CC}$: a power supply voltage, $x_B$: a junction depth in a base region, $x_{nmax}$: a maximum width of a depletion layer extending toward said collector between base and said collector, $C_{(x)}$: a concentration of impurities, diffused from said heavily doped impurity regions of the first and the second conductivity types, in said epitaxial layer of the second conductivity type, $x_1$: a depth in said substrate at which a concentration of the impurities, diffused from said heavily doped impurity regions of the first and the second conductivity types, in said epitaxial layer of the second conductivity type is equal to an impurity concentration in said epitaxial layer, $N_{EPI}$: the impurity concentration in said epitaxial layer, and $N_B$: an impurity concentration in said base region.

5. A device according to claim 2, wherein said bipolar transistor clement region is formed on said impurity region of the second conductivity type, said MOS transistor element region comprises a first MOS transistor element region including the first MOS transistor formed on said impurity region of the first conductivity type, and a second MOS transistor element region including the second MOS transistor formed on said impurity region of the second conductivity type.

6. A semiconductor integrated circuit device comprising:

a semiconductor substrate of a first conductivity type;

a plurality of heavily doped impurity regions of the first conductivity type and a second conductivity type selectively formed on said semiconductor substrate and having a higher impurity concentration than an impurity concentration of said semiconductor substrate;

an isolation region formed on one of said impurity regions of the first conductivity type;

a MOS transistor element region formed on said impurity region, a thickness of an epitaxial layer formed in said MOS transistor element region being a first thickness; and a bipolar transistor element region formed on said impurity region, a thickness of an epitaxial layer formed in said bipolar transistor element region being a second thickness, wherein the first thickness is larger than the second thickness, and wherein letting $T_1$ be the first thickness, $T_1$ is determined in accordance with equations (C-1), (C-2), (C-3), and (C-4) so that a variation $\Delta V_{th}$ in a threshold voltage of a MOS transistor formed in said MOS transistor element region caused by impurities diffused from said impurity regions of the first and the second conductivity types is not more than 10% of a threshold voltage $V_{th}$ of said MOS transistor, wherein $$V_{th} = V_{FB} + \Phi_F - \frac{Q_{BD}}{C_{OX}} \quad \text{(C-1)}$$

$$\Delta V_{th} = -\frac{\Delta Q_{BD}}{C_{OX}} \quad \text{(C-2)}$$

$$\Delta Q_{BD} = \int_0^{x_{dmax}} qC_{(x)}dx \quad \text{(C-3)}$$

$$C_{(x)} = \frac{C_1}{2}\left[ 1 + erf\left( \frac{x - T_1}{2\sqrt{D_1 t}} \right) \right] \quad \text{(C-4)}$$

x: a depth from a surface of said epitaxial layer, $x_{dmax}$: a maximum width of a depletion layer of said MOS transistor, $C_{ox}$: a gate capacitance, $V_{FB}$: a flat band voltage, $\phi_F$: a Fermi potential, q: an elementary charge, $c_{(x)}$: a concentration of the impurities, diffused from said heavily doped impurity regions of the first and the second conductivity types, in said epitaxial layer of the second conductivity type, $C_1$: an impurity concentration of said heavily doped impurity regions of the first and second conductivity types, $D_1$: a diffusion coefficient of impurities in said heavily doped impurity regions of the first and second conductivity types at a temperature of epitaxial growth, t: a time required for epitaxial growth, erf[ ]: an error function, $V_{th}$: a threshold voltage of said MOS transistor, $Q_{BD}$: a total amount of impurities present within the depletion layer (near a channel), $\Delta Q_{BD}$: a total change amount of impurities within the depletion layer near the channel caused by diffusion of the impurities from said heavily doped impurity regions of the first and second conductivity types, and $\Delta V_{th}$: a change amount of $V_{th}$ caused by a change in an impurity concentration near the channel.

* * * * *